(12) United States Patent
Selvamanickam et al.

(10) Patent No.: US 7,025,826 B2
(45) Date of Patent: Apr. 11, 2006

(54) METHODS FOR SURFACE-BIAXIALLY-TEXTURING AMORPHOUS FILMS

(75) Inventors: Venkat Selvamanickam, Wynantskill, NY (US); Xuming Xiong, Niskayuna, NY (US)

(73) Assignee: Superpower, Inc., Schenectady, NY (US)

( * ) Notice: Subject to any disclaimer, the term of this patent is extended or adjusted under 35 U.S.C. 154(b) by 210 days.

(21) Appl. No.: 10/643,403

(22) Filed: Aug. 19, 2003

(65) Prior Publication Data

US 2005/0039672 A1 Feb. 24, 2005

(51) Int. Cl.
*C30B 1/02* (2006.01)
(52) U.S. Cl. ............... 117/3; 117/2; 117/4; 117/9; 117/95; 117/96; 505/929
(58) Field of Classification Search ............ 117/2, 117/3, 4, 9, 95, 96; 503/929
See application file for complete search history.

(56) References Cited

U.S. PATENT DOCUMENTS

| | | | | |
|---|---|---|---|---|
| 5,958,599 | A * | 9/1999 | Goyal et al. | 428/457 |
| 6,258,472 | B1 * | 7/2001 | Neumuller et al. | 428/701 |
| 6,309,767 | B1 * | 10/2001 | Nies | 428/689 |
| 6,337,991 | B1 * | 1/2002 | Li et al. | 505/161 |
| 6,361,598 | B1 | 3/2002 | Balachandran et al. | |
| 6,391,828 | B1 * | 5/2002 | Nies | 505/237 |
| 6,537,689 | B1 | 3/2003 | Schoop et al. | |
| 6,730,410 | B1 * | 5/2004 | Fritzemeier et al. | 428/469 |
| 2002/0031686 | A1 * | 3/2002 | Jia et al. | 428/697 |
| 2004/0096707 | A1 * | 5/2004 | Sambasivan et al. | 428/698 |

OTHER PUBLICATIONS

Iijima, Y. et al., *In-plane Aligned YBa$_2$Cu$_3$O$_{7-x}$ Thin Films Deposited on Polycrystalline Metallic Substrates*, Appl. Phys. Lett., vol. 60, No. 6, pp. 769-771 (1992).

Wu, X. D.. et al., *Properties of YBa$_2$Cu$_3$O$_{7-x}$ Thick Films on Flexible Buffered Metallic Substrates*, Appl. Phys. Lett., vol. 67, No. 16, pp. 2397-2399 (1995).

Freyhardt, H. C., et al., *YBaCuO Thick Films on Planar and Curved Technical Substrates*, IEEE Transactions on Applied Superconductivity, vol. 7, No. 2, pp. 1426-1431 (Jun. 1997).

Foltyn, Stephen R., et al., *High-$T_c$ Coated Conductors—Performance of Meter-Long YBCO/IBAD Flexible Tapes*, IEEE Transactions on Applied Superconductivity, vol. 9, No. 2, pp. 1519-1522 (Jun. 1999).

Groves, James R., et al., *Recent Progress in Continuously Processed IBAD MgO Template Meters for HTS Applications*, Physica C, 382 (2002) 43-47.

Bauer, M., et al., *YBCO Films on Metal Substrates with Biaxially Aligned MgO Buffer Layers*, IEEE Transactions on Applied Superconductivity, vol. 9, No. 2, pp. 1502-1505 (1999).

Reade, R. P., *Ion-Beam Nanotexturing of Buffer Layers for Near-Single-Crystal Thin-Film Deposition to YBa$_2$Cu$_3$O$_{7-\delta}$ Superconducting Films*, Appl. Phys. Lett., vol. 80, No. 8, pp. 1352-1354 (2002).

Hasegawa, K. et al., *In-Plane Aligned YBCO Thin Film Tape Fabricated by Pulsed Laser Deposition*, Proc. Of 16$^{th}$ ICEC/ICMC, Amsterdam: Elservier Science, pp. 1413-1416 (1997).

* cited by examiner

*Primary Examiner*—Robert Kunemund
(74) *Attorney, Agent, or Firm*—Toler, Larson & Abel, LLP

(57) ABSTRACT

Methods for biaxially-texturing a surface-region of an amorphous material are disclosed, comprising depositing an amorphous material onto a substrate, and supplying active oxygen near the substrate during ion beam bombardment of the amorphous material to create an amorphous material having a biaxially textured surface, wherein the ion beam bombardment occurs at a predetermined oblique incident angle. Methods for producing high-temperature coated superconductors are also disclosed, comprising depositing an amorphous buffer film onto a metal alloy substrate, bombarding a surface-region of the amorphous buffer film with an ion beam at an oblique incident angle while supplying active oxygen to the surface-region of the amorphous buffer film in order to create a biaxially textured surface-region thereon, and growing a superconducting film on the biaxially textured surface-region of the amorphous buffer film to create a high-temperature coated superconductor.

39 Claims, No Drawings

US 7,025,826 B2

METHODS FOR SURFACE-BIAXIALLY-TEXTURING AMORPHOUS FILMS

FIELD OF THE INVENTION

This invention relates generally to the field of second-generation superconducting materials. More specifically, it relates to rapid ion beam assisted deposition (IBAD) of buffer layers for making superconductor-coated tapes. Even more specifically, it relates to processing methods for depositing, at a very high rate, surface-biaxially-textured amorphous films on continuously moving metal tapes.

BACKGROUND OF THE INVENTION

Second-generation superconducting tapes, such as those based on $YBa_2Cu_3O_{7-\delta}$ (YBCO) films, are being developed to carry large amounts of electrical current without electrical resistance. Such second-generation, high temperature superconductors (HTS) typically comprise biaxially textured (narrow out-of-plane and in-plane grain orientation distributions) buffer layers deposited on a metal substrate, such as a metal tape. It is known that the biaxially textured buffer layer enables high current densities in YBCO films, among others.

Several attempts have been made to grow sharply-textured YBCO films with high critical current density on flexible metal tapes. In one approach, a biaxially textured buffer layer was deposited using ion beam assisted deposition (IBAD) on a Ni-based alloy tape such as Hastelloy® (S. R. Foltyn et al., IEEE Transactions on Applied Superconductivity 9 (1999) pp. 1519–1522). The IBAD of a buffer layer of yttria-stabilized zirconia (YSZ) was the first demonstrated process to achieve biaxially textured buffer layers, and has led to the fabrication of several of the longest and best performing YBCO superconductors. It is generally accepted that texture development in IBAD YSZ is based on a growth competition mechanism. As a result, one disadvantage of this method is that thick layers must be grown in order to achieve good in-plane texture. For example, typically, buffer layers that are more than about 1,000 nm in thickness must be grown in order to achieve in-plane textures of less than 15 degrees full-width-at-half-maximum (FWHM). This problem is further exacerbated by the very low deposition rate (about 0.1 nm per second) needed to grow high quality IBAD YSZ. The combination of thick films and low deposition rates necessitates long deposition times (usually hours) to grow a buffer layer with a thickness greater than about 1,000 nm. Therefore, this process may not be suitable for industrial applications.

It is also known that IBAD of MgO has been used to achieve very good biaxial-texture in about 10 nm thick films using a deposition rate of about 0.1 nm/s (J. R. Groves et al., Proc. 2001 Intl. Workshop on Superconductivity, Honolulu, Hi. (Jun. 24–27, 2001), p. 3). This IBAD process can be about 100 times faster than IBAD YSZ. However, one disadvantage of this method is that the IBAD MgO method requires at least three additional layers in the buffer structure. The first is an amorphous seed layer, the second is a thick homo-epitaxially grown MgO layer, and the third is yet another layer for better lattice matching with YBCO. By requiring three additional layers in the superconductor, additional time and effort are needed to process the buffer structure. Also, the biaxial texture of MgO is very sensitive to the roughness of the underlying substrate and other factors. Therefore, it may be difficult to achieve high yields when manufacturing IBAD MgO-based buffer layers.

Inclined substrate deposition (ISD) of MgO without the assistance of ion beam bombardment has been shown to achieve high deposition rates (K. Hasegawa et al., Proc. of 16th ICEC/ICMC, Amsterdam: Elservier Science (1997), p. 1413; and M. Bauer et al. IEEE Transactions on Applied Superconductivity 9 (1999) p. 1502). The high deposition rates of this process can minimize the time for coating long wires. However, the quality of film produced by this method is poor compared to the quality produced using the IBAD method, and the c-axis in the MgO buffer layers is tilted off surface normal in this method. This makes the $J_c$ anisotropic, and the $J_c$ decreases greatly along the tilt direction. Additionally, the films deposited by the ISD method tend to have a rough surface with a pattern similar to "roofing tiles."

In an additional approach, ion beam nanotexturing (ITEX) of YSZ has been shown to produce biaxially textured YSZ in a matter of a few minutes (R. P. Reade et al., Applied Physics Letter, Vol. 80, No. 8 (2002) p. 1352). ITEX is similar to IBAD, except that in the ITEX method, an amorphous YSZ layer is first deposited, then, an oblique Ar+ ion beam at an angle of about 55 degrees is used to bombard the amorphous film with $O_2$ in a chamber. The result is a crystalline texture in the top surface of the amorphous layer. The ITEX method is very rapid, but yields a very poor in-plane texture of about 45°. An in-plane texture of about 10° or less is necessary in order to achieve good properties in the YBCO when deposited on the buffer layer.

Thus, there is a need in the art for a novel and robust IBAD process capable of producing long lengths of biaxially textured buffer layers. Such processes should create an ideal substrate for a subsequent deposition of YBCO or other superconductor. Such processes should substantially reduce process times. Such processes should result in an in-plane texture in the top surface region of the buffer layer of about 10° or less. Such processes should result in grain alignment on a large scale. Such processes should be suitable for manufacturing kilometer lengths of HTS coated conductors on flexible metal substrates at price and performance levels needed for numerous applications.

BRIEF SUMMARY OF THE INVENTION

To achieve the foregoing and other goals, and in accordance with the purpose of this invention, as embodied and broadly described herein, this invention provides processing methods for second-generation, high temperature coated superconductors. In various embodiments, this invention provides a superconducting structure including a substrate, a surface-biaxially-textured layer deposited overlying the substrate, and a film of oxide superconductor material deposited overlying the surface-biaxially-textured layer. One or more epitaxial buffer layers may be grown on the surface-biaxially-textured layer prior to the deposition of the superconducting film, if desired.

In embodiments, this invention provides methods for biaxially-texturing a surface-region of an amorphous material. One such method comprises depositing the amorphous material onto a substrate (i.e., a flexible, metal alloy), and supplying active oxygen near the substrate during ion beam bombardment of the amorphous material to biaxially texture the surface of the amorphous material, wherein the ion beam bombardment occurs at a predetermined oblique incident angle of about 0–45° between an ion beam and the surface of the amorphous material.

In embodiments, this invention also provides methods for producing a high-temperature coated superconductor. One such method comprises depositing an amorphous buffer film onto a metal alloy substrate, bombarding a surface-region of the amorphous buffer film with an ion beam at an oblique incident angle of about 0–45° between the ion beam and a surface of the amorphous buffer film while supplying active oxygen to the surface-region of the amorphous buffer film in order to biaxially texture the surface-region of the amorphous buffer film in order to create a surface-biaxially-textured region thereon; and growing a superconducting film on the surface-biaxially-textured region of the amorphous buffer film to create a high-temperature coated superconductor. One or more epitaxial buffer layers may be grown on the surface-biaxially-textured layer prior to deposition of the superconducting film, if desired.

In embodiments, the substrate temperature may be increased from about 22° C. to about 600° C. during bombardment. In other embodiments, the substrate temperature may be increased from about 22° C. to no more than about 300° C. during bombardment.

In embodiments, the active oxygen may comprise at least one of: atomic oxygen, oxygen ion, and/or ozone, and the active oxygen may be a component of the ion beam. Ideally, the active oxygen is operable for facilitating re-crystallization of the amorphous material and for reducing the oxygen partial pressure that is needed.

In embodiments, the surface-biaxially-textured region of the amorphous material comprises a thickness of about 5–10 nm, measured from the top of the amorphous material down. Suitable examples of amorphous materials include, but are not limited to, magnesium oxide (MgO), yttria-stabilized zirconia (YSZ), cerium oxide ($CeO_2$), and yttrium oxide ($Y_2O_3$). The amorphous material may be deposited in various ways, such as for example, by using electron beam evaporation, ion beam sputtering, magnetron sputtering, chemical vapor deposition, and/or pulsed laser deposition. Suitable examples of substrate materials include flexible metal alloys. Ideally, the metal alloy substrate will be as thin and flexible as possible, so that kilometer length wires, tapes or coils can be produced therefrom.

In embodiments, the method may further comprise growing a superconducting layer upon the surface-biaxially-textured amorphous material to create a high temperature coated superconductor. Ideally, the superconducting layer will have an in-plane texture of less than about 10° full-width-at-half-maximum (FWHM), and $J_c$ will be close to or above about 100,000 A/cm$^2$ at 77 Kelvin and 0 Tesla.

In embodiments, the method may also further comprise depositing at least one intermediate layer between the amorphous material and the superconducting layer, wherein the intermediate layer may comprise a homo-epitaxial buffer layer and/or a hetero-epitaxial buffer layer.

In embodiments, the method may further comprise utilizing the high temperature coated superconductor in at least one of: a power cable, a power transformer, a power generator, and a power grid. The power cable may comprise a conduit for passage of a cooling fluid, wherein the high temperature coated superconductor is disposed proximate the conduit. The power cable may comprise a power transmission cable and/or a power distribution cable. The power transformer may comprise one or more windings, wherein at least one winding comprises the high temperature coated superconductor. The power generator may comprise: a shaft coupled to a rotor comprising at least one electromagnet comprising one or more rotor coils, and a stator comprising a conductive winding surrounding the rotor, wherein the conductive winding or at least one of the rotor coils comprises the high temperature coated superconductor. The power grid may comprise: a power generation station comprising a power generator; a transmission substation comprising at least one power transformer for receiving power from the power generation station, and for stepping-up voltage for transmission; at least one power transmission cable for transmitting power from the transmission substation; a power substation comprising at least one power transformer for receiving power from the power transmission cables, and for stepping-down voltage for distribution; and at least one power distribution cable for distributing power to an end user.

DETAILED DESCRIPTION OF THE INVENTION

As required, detailed embodiments of this invention are disclosed herein, however, it is to be understood that the disclosed embodiments are merely exemplary of the invention that may be embodied in various and alternative forms. Specific structural and functional details disclosed herein are not to be interpreted as limiting, but merely as a basis for the claims as a representative basis for teaching one skilled in the art to variously employ this invention.

This invention describes processing methods for increasing deposition rates and improving the critical current density of oxide films of second-generation high temperature superconductors. Throughout the disclosure, the critical current density refers to a measurement of current carrying capacity and is abbreviated as $J_c$, measured in amperes per square centimeter (A/cm$^2$) at 77K. As is known in the art, the critical current density in oxide films is partly dependent on grain-to-grain misalignments, and higher $J_c$ values are associated with smaller misalignment angles. Devices utilizing second generation HTS require good control over the grain alignment of the materials comprising the HTS, since high-angle boundaries will impede current flow. The present invention describes processes for fabricating HTS with high critical current densities. In order to achieve these HTS, it is necessary to biaxially align essentially all of the grains of the surface region of a buffer layer thereon, thereby biaxially aligning essentially the entire superconducting film that is deposited thereon, resulting in a significant improvement in the superconducting properties of these films.

In order to create low-angle grain boundaries, it is necessary to create a biaxial texture in the material. A biaxially textured film, by definition, has both in-plane and out-of-plane crystal texture. A biaxially textured layer is defined herein as a polycrystalline material in which both the crystallographic in-plane and out-of-plane grain-to-grain misorientation is, in various embodiments, less than about 30°, less than about 20°, less than about 15°, less than about 10°, or less than about 5°, but in all embodiments greater than about 1°. The degree of biaxial texture in a material can be described by specifying the distribution of in-plane and out-of-plane grain orientations as determined by x-ray diffraction. A full-width-at-half-maximum (FWHM) of the rocking curve of the out-of-plane ($\Delta\theta$) and in-plane ($\Delta\Phi$) reflection can be determined. Therefore, the degree of biaxial texture can be defined by specifying the range of $\Delta\theta$ and $\Delta\Phi$ for a given sample.

One conventional technique to create a biaxial texture in a film involves ion beam assisted deposition (IBAD) as taught by Y. Iijima et al. ("In-Plane Aligned $YBa_2Cu_3O_{7-\delta}$ Thin Films Deposited on Polysrystalline Metallic Substrates", Appl. Phys. Lett. 60 (1992) 769). In this approach, a layer of YSZ is deposited and simultaneously bombarded with an ion beam at an angle of about 55° to obtain biaxial texture in the YSZ film. The major problem with this approach is that the YSZ deposition process is very time consuming since a thick YSZ film needs to be deposited at a very slow deposition rate in order to achieve the desired in-plane texture of about 12–17°.

This invention provides processing methods to quickly create biaxial texture. It comprises, first, depositing an amorphous film onto a substrate, and then bombarding this amorphous film with an oblique-angle ion beam while at the same time supplying active oxygen near the substrate to biaxially texture the surface of the amorphous material. The active oxygen helps to form a stable crystal structure during ion beam bombardment. Stable crystal structure benefits texture evolution. As such, active oxygen helps to yield better texture than the molecular oxygen commonly used in the prior art. By epitaxial growth, this biaxial texture will be imparted to any intermediate buffer layers, and any superconducting films, that are deposited on the surface-biaxially-textured amorphous film.

In various embodiments of this invention, the substrate may include, but is not limited to, any polycrystalline metal or metal alloy such as nickel alloy and the like. Nickel alloy may be preferred in some applications due to its high strength and temperature-resistant properties. During the deposition of the superconducting layer, it is typically necessary to achieve temperatures of about 800° C. in oxygen. Various alloys, such as Hastelloy® (Ni—Cr—Mo alloy) and Inconel® (Ni—Cr—V alloy), are resistant to oxygen and are suitable for use in the practice of the present invention. The metal substrate, upon which the amorphous surface layer(s), buffer layer(s) and superconducting layer(s) are eventually deposited, should preferably provide flexibility to the whole structure so that the structure may be shaped and wound in the form of a tape, cable or coil for various electric power applications. The flexible metal substrate utilized in embodiments of this invention is unique compared to flexible polymer substrates and rigid substrates (e.g., silicon, glass, gallium arsenide) used in the silicon and optoelectronics industries. The metal substrate utilized herein should be as thin and flexible as possible.

The surface-biaxially-textured amorphous layer of this invention may be deposited directly on a metal alloy substrate. As previously noted, one or more buffer layers may be deposited overlying the surface-biaxially-textured amorphous layer, or the surface-biaxially-textured amorphous layer may be a buffer layer itself. Such buffer layers provide a new template for growth of the subsequent superconducting layer(s). If the superconductor layer(s) were to be deposited directly upon the metal alloy substrate, the elements from the metal alloy substrate may diffuse into the superconductor layer and destroy the superconductivity thereof. Therefore, one or more intermediate layers (i.e., buffer layers) are needed to prevent the diffusion of metal species into the superconductor layer(s). In addition, the intermediate layer(s) should be biaxially textured so that the superconductor layer(s) will inherit its biaxial texture therefrom and sustain a high $J_c$.

Any material may be used for the surface-biaxially-textured amorphous layer(s) in this invention, provided that the material does not adversely react with the superconducting layer(s) or substrate. In embodiments of this invention, the surface-biaxially-textured amorphous layer comprises an oxide that is chemically and structurally compatible with the oxide superconductor. Examples of suitable materials for the surface-biaxially-textured amorphous layer include, but are not limited to, magnesium oxide (MgO), aluminum oxide ($Al_2O_3$), yttria-stabilized zirconia (YSZ), yttrium oxide ($Y_2O_3$), strontium ruthemium oxide ($SrRuO_3$), strontium titanate ($SrTiO_3$), lanthanum aluminum oxide ($LaAlO_3$), other rare-earth oxides such as cerium oxide ($CeO_2$), europium oxide ($Eu_2O_3$), erbium oxide ($Er_2O_3$), and/or combinations of any of these materials. In alternative embodiments, more complex oxides may be used as the surface layer material. In some embodiments, YSZ, MgO and $Y_2O_3$ may be used. MgO is much easier to crystallize than YSZ, and it is easy to produce $Y_2O_3$ in an amorphous phase or near-amorphous phase. In some applications, MgO may be used due to its low cost. The surface-biaxially-textured amorphous layer of this invention is stable and does not react with the superconducting material. The materials described above may be used alone or in combination. Each surface-biaxially-textured amorphous layer may have a general thickness in the range of about 10–500 nm, and is more preferably in the range of about 20–200 nm. However, the thickness of the surface-biaxially-textured amorphous layer may vary for selected applications.

One or more superconducting layers may be deposited upon the surface-biaxially-textured amorphous layer, which, as previously mentioned, may be a buffer layer. In some embodiments, one or more buffer layers may be deposited overlying the surface-biaxially-textured amorphous layer(s) prior to the deposition of the superconducting layers thereupon. The superconducting layer may be applied by any of a variety of conventional methods including, but not limited to, evaporation including co-evaporation and electron beam evaporation; sputtering including magnetron sputtering, ion beam sputtering, and ion assisted sputtering; chemical vapor deposition; organometallic chemical vapor deposition; plasma enhanced chemical vapor deposition; pulsed laser deposition; molecular beam epitaxy; a sol-gel process; a solution process; and liquid phase epitaxy.

Suitable examples of superconductor materials include, but are not limited to, oxide superconductor materials, such as yttrium barium copper oxides ($YBa_2Cu_3O_{7-\delta}$), rare-earth barium copper oxides, and/or mixtures of the two materials. In the case of rare-earth barium copper oxides, the yttrium of YBCO may be partially or completely replaced by rare-earth metals from the periodic table such as, but not limited to, gadolinium, terbium, dysprosium, lanthanum, neodymium, samarium, europium, holmium, erbium, thulium, and/or ytterbium. The superconducting material is preferably YBCO, although other minor variations of this basic superconducting material may be used. The superconducting film may have a general thickness in the range of about 0.5–20 μm, or more preferably in the range of about 1–5 μm. However, the thickness of the superconducting film may vary for selected applications.

The homo-epitaxial and/or hetero-epitaxial buffer layer(s) may be deposited on the surface-biaxially-textured amorphous layer(s) to inherit and solidify the texture thereof before the deposition of the superconducting layer(s) thereupon. The homo-epitaxial buffer layer may comprise the same material that is used for the surface-biaxially-textured amorphous layer(s). The hetero-epitaxial buffer layer may comprise any material having a good lattice match with YBCO, such as for example, $CeO_2$. The thickness of the buffer layer may be from about 10–100 nm, and is more preferably about 20 nm. The superconducting layer may then be deposited overlying the homo-epitaxial and/or hetero-epitaxial buffer layer(s).

The processing methods of this invention may be used to produce kilometer length superconducting tapes, cables or coils having one or more surface-biaxially-textured amorphous layers and an in-plane texture of less than about 10° full-width at half-maximum (FWHM), more preferably about 5° or less FWHM, after the deposition of only about 20–100 nm of the surface-biaxially-textured amorphous layer.

The processing methods of this invention involve supplying active oxygen in various forms, such as atomic oxygen, oxygen ion, and ozone, to the surface region of an amorphous material, such as YSZ or other material, during ion (Ar+) bombardment of a near-surface region of the amorphous material. Preferably, crystallinity is induced by bombarding the near-surface region of the amorphous layer with oxygen ion and argon ion, wherein the oxygen ion may be a component of the bombardment oblique-angle ion beam. The angle between the ion beam and the film surface is preferably in the range of about 0–45°, depending on the material used for the surface-biaxially-textured amorphous surface layer. The use of active oxygen facilitates the re-crystallization of the surface region of the surface-biaxially-textured amorphous layer and reduces the oxygen partial pressure needed for re-crystallization. During ion bombardment, oxygen is easily lost from the film, and the use of active oxygen retards this loss. In the case of YSZ, YSZ is made amorphous by a depletion of oxygen. Therefore, if the surface region of the surface-biaxially-textured amorphous layer is bombarded with argon and oxygen ions at an angle of about 0–45°, the YSZ can be crystallized and biaxially textured, leading to a biaxially textured surface region of the amorphous layer (i.e., a surface-biaxially-textured amorphous layer).

When some oxygen is depleted from an oxide material, the crystal structure of the oxide will become defective. When oxygen content in the material decreases beyond a certain limit, the film layer will have no crystalline structure, and the material will become amorphous. By adding the oxygen back, the material can be converted to a crystalline structure. By coupling the oxygen addition with a directed ion beam bombardment, the material can be recrystallized with a preferential surface texture. However, the ion bombardment itself results in oxygen loss. Therefore, by using active oxygen instead of molecular oxygen, the defects in the amorphous structure can be minimized, resulting in a highly crystalline and better textured material. When the active oxygen is provided in the form of oxygen ion as part of the bombarding ion beam, the driving force for crystallization and texture formation is achieved using the same source.

In embodiments, in addition to the oxygen ion bombardment, the substrate temperature may be gradually increased during oxygen ion bombardment to assist in re-crystallization and oxidation. The temperature of the substrate may be gradually increased from about 22° C. (room temperature) to about 600° C. In some embodiments, the temperature range may be increased from about 22° C. (room temperature) to about 300° C., but not over about 300° C. Gradually increasing the substrate temperature helps to achieve a biaxially textured surface, which can ultimately lead to the superconducting layer having a good critical current density.

The most important feature for growing sharply-textured YBCO films with a high critical current density is the surface texture of the immediately underlying buffer layer. As long as the surface region of the immediately underlying buffer layer is biaxially textured, with an in-plane grain boundary texture of less than about 10° degrees, the substrate and the other layers below the surface of the immediately underlying buffer layer can be amorphous. The amorphous buffer layer may be deposited using any of the standard techniques, including, but not limited to, electron beam evaporation, which results in extremely fast deposition rates and high throughput. The amorphous buffer layer deposition is separate from the surface texturing of the amorphous buffer layer. The amorphous buffer layer of this invention is not as thick as conventional IBAD-YSZ techniques. The amorphous buffer layer(s) utilized herein do not have to be deposited slowly. An amorphous buffer layer in this invention can be deposited at a very fast rate of about 3–10 nm/second. The distance that is biaxially textured, from the surface down, is preferably about 2–20 nm, or more preferably about 5–10 nm. By crystallizing only the near-surface region and focusing on that, production times may be decreased tremendously. Since this invention uses a combination of high rate deposition and thin material, a much higher throughput can be realized as compared to conventional ion beam processes.

The foregoing is a description of some preferred embodiments of the invention which were given here by way of example only. Although the processes of the present invention have been described with reference to some preferred embodiments and examples thereof, other embodiments and examples may perform similar functions and/or achieve similar results, and numerous modifications and variations will be apparent to those skilled in the art. All such equivalent embodiments and examples are deemed to be within the spirit and scope of the present invention and are intended to be covered by the following claims.

What is claimed is:

1. A method for biaxially-texturing a surface-region of an amorphous material, comprising:
   depositing the amorphous material onto a substrate;
   supplying active oxygen near the substrate during ion beam bombardment of the amorphous material to create an amorphous material having a biaxially textured surface, wherein the ion beam bombardment occurs at a predetermined oblique incident angle of about 0–45° between an ion beam and the surface of the amorphous material;
   depositing at least one intermediate layer overlying the amorphous material; and
   growing a superconducting layer overlying the at least one intermediate layer to create a high temperature coated superconductor, wherein the superconducting layer has a $J_c$ of greater than about 100,000 A/cm$^2$ at 77 Kelvin and 0 Tesla.

2. The method of claim 1, wherein the active oxygen comprises at least one of: atomic oxygen, oxygen ion, and ozone.

3. The method of claim 1, wherein the active oxygen is a component of the ion beam.

4. The method of claim 1, wherein the active oxygen is operable for facilitating re-crystallization of the amorphous material and for reducing an oxygen partial pressure.

5. The method of claim 1, wherein the biaxially textured surface of the amorphous material comprises a thickness of about 2–20 nm.

6. The method of claim 1, wherein the biaxially textured surface of the amorphous material comprises a thickness of about 5–10 nm.

7. The method of claim 1, wherein the amorphous material comprises at least one of: magnesium oxide (MgO), yttria-stabilized zirconia (YSZ), cerium oxide (CeO$_2$), and yttrium oxide (Y$_2$O$_3$).

8. The method of claim 1, wherein the substrate is a flexible metal alloy.

9. The method of claim 1, wherein the temperature of the substrate is increased from about 22° C. to about 600° C. during ion beam bombardment.

10. The method of claim 1, wherein the temperature of the substrate is increased from about 22° C. to no more than 300° C. during ion beam bombardment.

11. The method of claim 1, wherein the amorphous material is deposited onto the substrate using at least one of: electron beam evaporation, ion sputtering, magnetron sputtering, pulsed laser deposition, and chemical vapor deposition.

12. The method of claim 1, wherein the superconducting layer has an in-plane texture of less than about 20° full-width-at-half-maximum (FWHM).

13. The method of claim 1, wherein the intermediate layer comprises at least one of: a homo-epitaxial buffer layer and a hetero-epitaxial buffer layer.

14. The method of claim 13, wherein the hetero-epitaxial buffer layer has a good crystal lattice match with a predetermined superconducting material.

15. The method of claim 14, wherein the hetero-epitaxial buffer layer comprises cerium oxide ($CeO_2$).

16. The method of claim 1, further comprising utilizing the high temperature coated superconductor in at least one of: a power cable, a power transformer, a power generator, and a power grid.

17. The method of claim 16, wherein the power cable comprises a conduit for passage of a cooling fluid, and wherein the high temperature coated superconductor is disposed proximate the conduit.

18. The method of claim 17, wherein the power cable comprises at least one of: a power transmission cable and a power distribution cable.

19. The method of claim 16, wherein the power transformer comprises one or more windings, wherein at least one winding comprises the high temperature coated superconductor.

20. The method of claim 16, wherein the power generator comprises:
a shaft coupled to a rotor comprising at least one electromagnet comprising one or more rotor coils, and
a stator comprising a conductive winding surrounding the rotor,
wherein the conductive winding or at least one of the rotor coils comprises the high temperature coated superconductor.

21. The method of claim 16, wherein the power grid comprises:
a power generation station comprising a power generator;
a transmission substation comprising at least one power transformer for receiving power from the power generation station, and for stepping-up voltage for transmission;
at least one power transmission cable for transmitting power from the transmission substation;
a power substation comprising at least one power transformer for receiving power from the power transmission cables, and for stepping-down voltage for distribution; and
at least one power distribution cable for distributing power to an end user.

22. A method for producing a high-temperature coated superconductor, comprising:
depositing an amorphous buffer film onto a metal alloy substrate;
bombarding a surface-region of the amorphous buffer film with an ion beam at an oblique incident angle of about 0–45° between the ion beam and a surface of the amorphous buffer film while supplying active oxygen to the surface-region of the amorphous buffer film in order to create a biaxially textured surface-region thereon;
growing a superconducting film on the biaxially textured surface-region of the amorphous buffer film to create a high-temperature coated superconductor; and
depositing at least one intermediate layer between the amorphous buffer film and the superconducting film.

23. The method of claim 22, wherein the active oxygen comprises at least one of: atomic oxygen, oxygen ion, and ozone.

24. The method of claim 22, wherein the oxygen ion is a component of the ion beam.

25. The method of claim 22, wherein the biaxially textured surface-region of the amorphous buffer film comprises a thickness of about 2–20 nm.

26. The method of claim 22, wherein the biaxially textured surface-region of the amorphous buffer film comprises a thickness of about 5–10 nm.

27. The method of claim 22, wherein the amorphous buffer film comprises at least one of: magnesium oxide (MgO), yttria-stabilized zirconia (YSZ), and yttrium oxide ($Y_2O_3$).

28. The method of claim 22, wherein the amorphous buffer film is deposited onto the metal alloy substrate using at least one of: electron beam evaporation, ion sputtering, magnetron sputtering, pulsed laser deposition, and chemical vapor deposition.

29. The method of claim 22, wherein the superconducting film has a $J_c$ greater than about 1,000,000 $A/cm^2$.

30. The method of claim 22, further comprising producing kilometer length tapes, cables or coils comprising the high-temperature coated superconductor.

31. The method of claim 22, wherein the intermediate layer comprises at least one of: a homoepitaxial buffer layer and a hetero-epitaxial buffer layer.

32. The method of claim 31, wherein the hetero-epitaxial buffer layer has a good crystal lattice match with a predetermined superconducting material.

33. The method of claim 32, wherein the hetero-epitaxial buffer layer comprises cerium oxide ($CeO_2$).

34. The method of claim 22, further comprising utilizing the high-temperature coated superconductor in at least one of: a power cable, a power transformer, a power generator, and a power grid.

35. The method of claim 34, wherein the power cable comprises a conduit for passage of a cooling fluid, and wherein the high-temperature coated superconductor is disposed proximate the conduit.

36. The method of claim 35, wherein the power cable comprises at least one of: a power transmission cable and a power distribution cable.

37. The method of claim 34, wherein the power transformer comprises one or more windings, wherein at least one winding comprises the high-temperature coated superconductor.

38. The method of claim 34, wherein the power generator comprises:
a shaft coupled to a rotor comprising at least one electromagnet comprising one or more rotor coils, and
a stator comprising a conductive winding surrounding the rotor,
wherein the conductive winding or at least one of the rotor coils comprises the high-temperature coated superconductor.

39. The method of claim 34, wherein the power grid comprises:
- a power generation station comprising a power generator;
- a transmission substation comprising at least one power transformer for receiving power from the power generation station, and for stepping-up voltage for transmission;
- at least one power transmission cable for transmitting power from the transmission substation;
- a power substation comprising at least one power transformer for receiving power from the power transmission cables, and for stepping-down voltage for distribution; and
- at least one power distribution cable for distributing power to an end user.

* * * * *